United States Patent
Chang et al.

[11] Patent Number: 5,817,562
[45] Date of Patent: Oct. 6, 1998

[54] METHOD FOR MAKING IMPROVED POLYSILICON FET GATE ELECTRODE STRUCTURES AND SIDEWALL SPACERS FOR MORE RELIABLE SELF-ALIGNED CONTACTS (SAC)

[75] Inventors: Tzong-Sheng Chang, Chang-Hua; Chen-Cheng Chou, Taichung; Jenn Tsao, Taipei, all of Taiwan

[73] Assignee: Taiwan Semiconductor Manufacturing Company, Ltd, Hsin-Chu, Taiwan

[21] Appl. No.: 789,212

[22] Filed: Jan. 24, 1997

[51] Int. Cl.⁶ .................................................. H01L 21/336
[52] U.S. Cl. .......................................... 438/305; 438/595
[58] Field of Search ..................................... 438/305, 306, 438/307, 586, 595

[56] References Cited

U.S. PATENT DOCUMENTS

| | | | |
|---|---|---|---|
| 4,912,061 | 3/1990 | Nasr | 437/44 |
| 5,102,816 | 4/1992 | Manukonda et al. | 437/44 |
| 5,153,145 | 10/1992 | Lee et al. | 437/44 |
| 5,254,490 | 10/1993 | Kondo | 438/595 |
| 5,264,391 | 11/1993 | Son et al. | 437/195 |
| 5,286,667 | 2/1994 | Lin et al. | 438/305 |
| 5,290,720 | 3/1994 | Chen | 437/41 |
| 5,378,654 | 1/1995 | Hsue | 437/195 |
| 5,707,901 | 1/1998 | Cho et al. | 438/595 |

Primary Examiner—Chandra Chaudhari
Attorney, Agent, or Firm—George O. Saile; Stephen B. Ackerman

[57] ABSTRACT

A method was achieved for making FET stacked gate electrode structures with improved sidewall profiles. These more vertical sidewalls improve the control tolerance of the gate electrode length ($L_{eff}$) and improve the shape of the sidewall spacers for making more reliable metal contacts to the self-aligned source/drain contact areas. The method uses a stacked gate electrode layer having a TEOS oxide and a hard mask of silicon nitride on the gate electrode polysilicon layer. During patterning of the stacked gate electrode structure using a photoresist mask, the hard mask minimizes the buildup of a polymer on the TEOS oxide sidewall. This polymer would otherwise act as a masking material resulting in an abrupt step at the TEOS oxide/polysilicon interface when the polysilicon etch is completed. This results in improved gate electrode line length tolerance and much improved sidewall spacers that minimize electrical shorts between the metal source/drain contacts and the polysilicon gate electrodes.

24 Claims, 8 Drawing Sheets

FIG. 1 – Prior Art

METHOD FOR MAKING IMPROVED POLYSILICON FET GATE ELECTRODE STRUCTURES AND SIDEWALL SPACERS FOR MORE RELIABLE SELF-ALIGNED CONTACTS (SAC)

BACKGROUND OF THE INVENTION (1) Field of the Invention

The present invention relates to the fabrication of integrated circuit devices on semiconductor substrates, and more particularly relates to a method for making more reliable self-aligned source/drain contacts on field effect transistors (FETs) using a hard mask on the FET stacked gate electrode structure to form more vertical gate electrode sidewalls. This improves the tolerance control of the gate electrode length and improves the sidewall spacers which minimizes electrical shorts between the source/drain contact and gate electrode.

(2) Description of the Prior Art

One type of semiconductor device most commonly used for Ultra Large Scale Integration (ULSI) is the Field Effect Transistor (FET). These FET devices are sometimes fabricated by forming a polysilicon gate electrode having self-aligned source/drain contact (SAC) areas adjacent to the gate electrode, and are referred to as SAC-FETs. These SAC-FETs are preferred because of their small size, high packing density, low power consumption, high yields, and low manufacturing cost.

Conventional SAC-FETs are typically fabricated by patterning a stacked gate electrode layer comprised of a polysilicon layer and a silicon oxide ($SiO_2$) layer over a thin gate oxide on the device areas of a single crystal semiconductor substrate. The gate electrode structure is itself used as an implant barrier mask to form self-aligned lightly doped source/drain areas, often referred to as the LDD areas, in the substrate adjacent to the sides of the gate electrode. Insulating sidewall spacers are formed next and serve to mask the LDD areas, while the heavily doped source/drain contact areas are formed by ion implantation.

Unfortunately, several processing problems arise which limit the tolerance control on the length of the gate electrode, and which lead to unreliable source/drain metal contacts that can electrically short to the polysilicon gate electrode. These problems are best illustrated in the prior art of FIG. 1. An FET gate electrode structure formed on a $P^+$ silicon substrate 8 is shown having a $P^-$ epitaxial layer 10. The gate electrode structure is comprised of a gate oxide 14 and a heavily doped polysilicon layer 16 having on its surface a silicon oxide layer 18 formed by chemical vapor deposition (CVD) using tetraethosiloxane (TEOS). Typically when the silicon oxide layer 18 and the polysilicon layer 16 are patterned using a photoresist mask and anisotropic plasma etching, a polymer forms on the sidewalls of the silicon oxide layer 18. Subsequent etching of the gate polysilicon layer 16 results in an abrupt step at the interface between the silicon oxide layer 18 and the underlying gate polysilicon layer 16 at the sidewalls. The abrupt step resulting from this polymer formation makes it difficult to control the tolerance of the gate electrode length, which subsequently can affect the electrical performance of the device. A second problem occurs when the insulating sidewall spacers 28 are made by depositing and etching back a second insulating layer, as shown in FIG. 1.

These poorly shaped sidewall spacers can result in electrical shorts between the source/drain metal contacts and the polysilicon gate electrodes when the self-aligned contacts are later etched. Continuing with the process, a stress release (or pre-source/drain oxide) 24 is grown on the epitaxy layer 10 and a conformal silicon nitride ($Si_3N_4$) layer 30 is deposited. An interlevel insulating layer 32, such as a borophosphosilicate (BPSG), is deposited and planarized. Using conventional photolithographic means, self-aligned source/drain contact openings 1 are then selectively wet etched in the BPSG layer 32 to the silicon nitride layer 30, and the $Si_3N_4$ layer is removed by dry etching (plasma etching). A pre-metal wet etch is then used to remove the pre-source/drain oxide 24 and/or any native oxide that may have formed before the metal deposition to ensure good ohmic contact. However, during the etchings, the poorly formed sidewall spacers 28 can be eroded at the abrupt step between TEOS oxide layer 18 and polysilicon layer 16 (point A in FIG. 1), resulting in electrical shorts between the metal contacts 34 and the polysilicon gate electrode 16, or worse yet, device failure can occur after the product containing the circuit is in the field.

There are several references that describe methods for making improved self-aligned contacts for FETs, but do not directly address the problems described above and depicted in FIG. 1. For example, G. Son et al. in U.S. Pat. No. 5,264,391 describe a method for using a patterned polysilicon layer as an etch-stop layer for dry etching self-aligned source/drain contact openings without causing electrical shorts. In another approach by K. H. Lee et al., U.S. Pat. No. 5,153,145, a conventional L-shaped silicon nitride sidewall spacer is used. In a first embodiment the polysilicon gate electrode is patterned first and then coated with a silicon oxide and silicon nitride, which is etched back to form spacers with L-shaped $Si_3N_4$ portions. In a second embodiment a stacked gate electrode structure is patterned from a silicon nitride/polysilicon layer and, a second silicon nitride layer and silicon oxide layer are etched back to form the spacer with L-shaped $Si_3N_4$. But neither embodiment addresses the concerns of etching a stacked gate electrode structure having a silicon nitride-TEOS oxide-polysilicon layer. Another method for making self-aligned contacts is described by C. C. Hsue et al., U.S. Pat. No. 5,378,654. The method patterns a polysilicon-dielectric layer to form gate electrodes, and a silicon oxide layer is deposited and etched back to form sidewall spacers, but does not address the need for using the silicon nitride etch stop or the concern cited above and in FIG. 1. Another method is described by L. Chen, U.S. Pat. No. 5,290,720 in which an L-shaped silicon is formed in the sidewall spacer and is electrically connected to the gate electrode by a top silicide layer to form a T-gate structure. A. I. Nasr, U.S. Pat. No. 4,912,061 also teaches a method for making spacers with L-shaped silicon nitride and then forms a salicide process. The method does not etch a stacked gate electrode structure, and therefore does not address the prior art concern described above and depicted in FIG. 1. V. R. Manukonda et al., U.S. Pat. No. 5,102,816, also describe an improved sidewall spacer structure, but etch the polysilicon layer first and then deposit a conformal silicon nitride-silicon oxide layer to form L-shaped spacers. The Manukonda et al. method does not require the need to etch back a stacked gate electrode structure. None of the above references addresses the need to etch self-aligned source/drain contact openings in a thick interlevel dielectric layer (IDL) without eroding the stack or spacer layer.

Therefore, there is still a strong need in the semiconductor industry to improve the profile of the stacked gate electrodes for better gate length tolerance control and to improve the profile of the sidewall spacers to minimize electrical shorts and for greater product reliability.

SUMMARY OF THE INVENTION

It is therefore a principal object of this invention to improve the profile of the gate electrodes by making a more vertical sidewall on the gate electrode by including a hard mask in the stacked gate electrode structure.

It is a further object of this invention to provide an L-shaped silicon nitride spacer as part of the insulating spacer structure to improve the FET reliability.

In summary, this invention provides a method for fabricating gate electrodes having self-aligned source/drain contact areas for field effect transistors (FETs). The method utilizes a stacked dielectric layer, comprising a chemical vapor deposited (CVD) TEOS silicon oxide layer and a hard mask composed of silicon nitride, over a doped polysilicon layer. The stacked dielectric layer and polysilicon layer are then patterned to form the stacked gate electrode structures. The presence of the silicon nitride layer during plasma etching minimizes the polymer buildup on the sidewalls of the TEOS layer. This prevents the formation of an abrupt step (as shown in the prior art of FIG. 1) at the TEOS oxide/polysilicon interface when the polysilicon is subsequently etched in the same etcher. The vertical sidewalls on the gate electrode structures also allow for the formation of sidewall spacers with much improved shape. These sidewall spacers are formed having an L-shaped silicon nitride portion which is contiguous with the hard mask. This prevents erosion of the TEOS oxide which can eventually lead to electrical shorts between the source/drain metal contacts and the polysilicon gate electrodes.

The fabrication process provides a semiconductor substrate, typically composed of a heavily doped single crystal silicon having a lightly doped epitaxial layer formed on the top surface. Either N-channel or P-channel FETs can be made depending on the polarity of the dopant. However, the method is described for forming only the N-channel FETs to simplify the discussion.

The method starts by providing a $P^+$ doped silicon substrate having a $P^-$ doped epitaxial layer grown on its surface. A gate oxide is grown on the device areas on the epitaxial surface. A polysilicon layer is deposited that is $N^+$ doped by ion implantation, such as with arsenic ions ($As^{75}$). A stacked dielectric layer comprised of a first insulating layer, preferably composed of silicon oxide ($SiO_2$), and a hard mask layer, preferably composed of silicon nitride ($Si_3N_4$), are deposited on the first polysilicon layer. The $SiO_2$ is deposited by low pressure chemical vapor deposition (LPCVD) using TEOS as a reactant gas. Conventional lithographic techniques and anisotropic plasma etching are used to pattern the stacked dielectric layer and the polysilicon layer to form gate electrode structures having vertical sidewalls. The $Si_3N_4$ hard mask minimizes the buildup of polymer on the sidewall of the TEOS oxide and therefore allows the subsequent etching of the polysilicon without forming an abrupt step on the sidewall at the TEOS oxide/polysilicon interface. This allows the formation of sidewall spacers having a much improved shape. Lightly doped source/drain areas are formed in the device areas adjacent to the gate electrode structures. A polysilicon oxide layer is grown by thermal oxidation on the sidewalls of the polysilicon layer and concurrently on the lightly doped source/drain areas. Dual-dielectric L-shaped $Si_3N_4$ sidewall spacers are formed next by depositing a conformal first silicon nitride layer over the stacked gate electrode structures, followed by the deposition of a conformal second insulating layer, preferably a TEOS silicon oxide, on the first $Si_3N_4$ layer. The TEOS oxide and silicon nitride layers are then anisotropically plasma etched back to form insulating sidewall spacers having L-shaped silicon nitride. The silicon nitride portion of the sidewall is contiguous with the silicon nitride hard mask layer which remains in place as part of the stacked gate electrode structure. Source/drain contact areas are formed in the device areas adjacent to the sidewall spacers by ion implanting, for example, arsenic ions ($As^{75}$). A conformal second silicon nitride layer is deposited, followed by the deposition of a third insulating layer. Preferably the third insulating layer is composed of a borophosphosilicate glass (BPSG) and is deposited by LPCVD. The BPSG is then annealed to form an essentially planar surface. Source/drain contact openings are formed next by photoresist masking and selectively wet etching the third insulating layer to the second silicon nitride layer. The silicon nitride layer serves as an etch-stop layer for the wet etching. The contact openings extend partially over the stacked gate electrode structures thereby forming self-aligned source/drain contact openings over the source/drain contact areas. The second silicon nitride layer is then removed in the source/drain contact openings by plasma etching, exposing the portion of the polysilicon oxide layer that was formed on the source/drain areas when the polysilicon sidewalls were previously oxidized. The exposed polysilicon oxide layer and any native oxide are then removed in a pre-metal wet-etch dip thereby exposing the source/drain contact areas. The FET is now completed by depositing and patterning a metal layer to form electrical contacts to the source/drain contact areas. The improved shape of the sidewall spacer having the L-shaped silicon nitride layer contiguous with the silicon nitride hard mask prevents erosion of the sidewall during the wet-etching step. This prevents electrical shorts that would otherwise occur between the metal contacts and the polysilicon gate electrodes.

BRIEF DESCRIPTION OF THE DRAWINGS

The objects and other advantages of this invention are best understood by the preferred embodiment with reference to the attached drawings which are now briefly described.

DESCRIPTION OF THE PREFERRED EMBODIMENT

Figure 1:
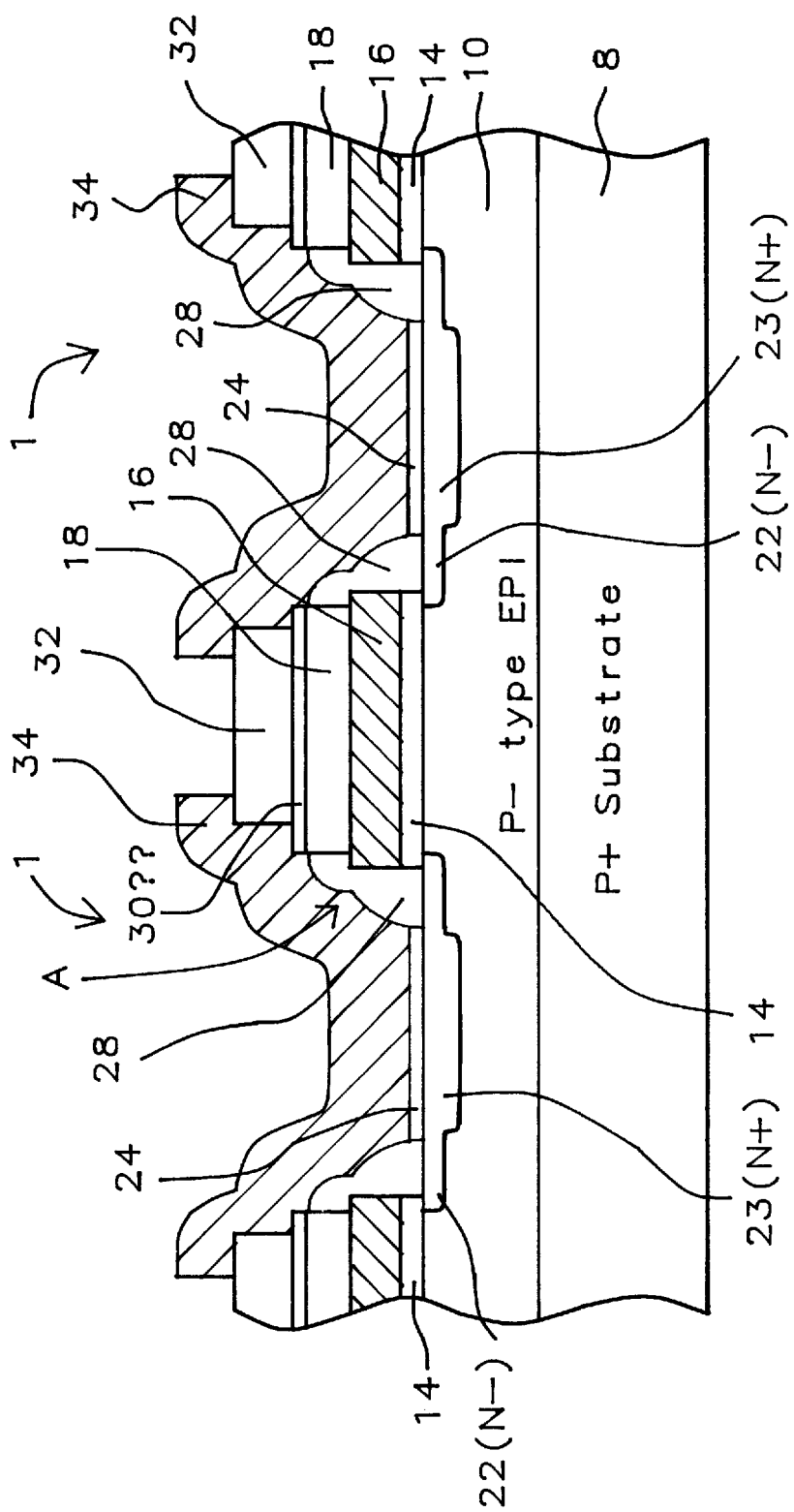
FIG. 1 shows a schematic cross-sectional view of an FET made from a stacked gate electrode structure depicting the undesirable abrupt step in the gate electrode and the poorly formed sidewall spacers using the prior art.

The present invention is now described in more detail for making an improved field effect transistor having self-aligned source/drain contacts. The method uses a stacked dielectric/polysilicon layer which is patterned to form improved gate electrode structures which eliminate the abrupt step along the sidewall at the interface between the dielectric layer and the polysilicon layer. The vertical sidewalls of the gate electrodes also provide for forming more ideal sidewall spacers, which eliminate the problems associated with the more conventional prior art process, as depicted in FIG. 1 and described in the Background of the Invention. Although the method is described for making an N-channel FET on a P-doped substrate, it should be obvious to one skilled in the art that the method can be applied equally to the formation of P-channel FETs on N-doped substrates, and indeed can be applied to making P-channel and N-channel FETs using P- and N-doped wells on the same substrate thereby allowing for the fabrication of CMOS circuits.

Figure 2:
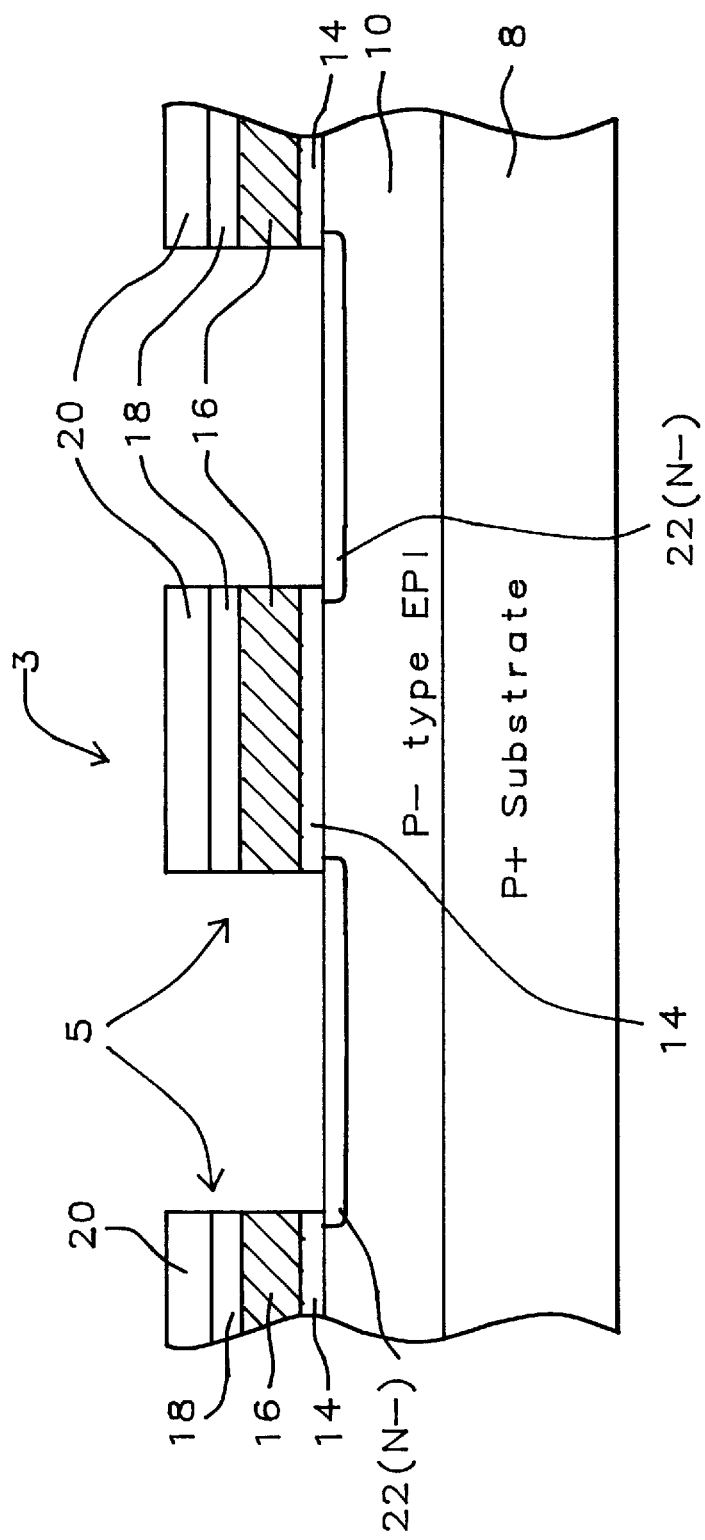
FIGS. 2–7 show schematic cross-sectional views for making an FET with self-aligned source/drain contacts having improved gate electrode profiles and improved sidewall spacers.

Referring now to FIG. 2, a portion of the semiconductor substrate 8 is shown having a partially completed field effect transistor along with a portion of two other FETs on each sides Preferably the substrate 8 is a P$^+$ doped single crystal silicon having, for example, a <100> crystallographic orientation. A P$^-$ doped silicon epitaxial film 10 is then grown on the substrate surface 8 using conventional chemical vapor deposition (CVD). Only the device area is depicted in the Figs. to simplify the drawings, but it should be understood that the device areas are typically surrounded and electrically isolated by field oxide regions.

Still referring to FIG. 2, an FET gate oxide 14 is grown on the surface of the epitaxial layer 10. Typically the gate oxide is formed by thermal oxidation, for example, by subjecting the substrate to dry oxygen in an oxidation furnace. Preferably the gate oxide is grown to a thickness of between about 150 and 250 Angstroms. The stacked gate electrode structure is formed next by depositing a polysilicon layer 16 on which is deposited a stacked dielectric layer. Typically polysilicon layer 16 is grown by low pressure chemical vapor deposition (LPCVD) using, for example, silane ($SiH_4$) as the reactant gas, and is deposited to a thickness of between about 2000 and 3500 Angstroms. Polysilicon layer 16 is then N$^+$ doped by ion implantation using, for example, either arsenic ions ($As^{75}$) or phosphorus ions ($p^{31}$) After implantation the preferred dopant concentration in layer 16 is between about 1.0 E 19 and 1.0 E 21 atoms/cm$^3$. Continuing, the stacked dielectric layer is formed from a first insulating layer 18, preferably a silicon oxide ($SiO_2$), deposited by LPCVD using tetraethosiloxane (TEOS). Layer 18 is deposited to a preferred thickness of between about 540 and 660 Angstroms. The stacked dielectric layer is now completed by forming a hard mask layer 20 on the first insulating layer 18. Preferably hard mask layer 20 is composed of silicon nitride ($Si_3N_4$). The silicon nitride is deposited, for example, by LPCVD using a reactant gas such as dichlorosilane ($SiCl_2H_2$) and ammonia ($NH_3$). Layer 20 is deposited to a preferred thickness of between about 1350 and 1650 Angstroms.

The stacked gate electrode structure 3 (FIG. 2) is then patterned using conventional lithographic techniques and anisotropic plasma etching. Preferably the etching of the various layers 20, 18, and 16 is carried out sequentially in a reactive ion etcher or a high-density plasma etcher in gas mixtures comprised of trifluoromethane ($CHF_3$), oxygen ($O_2$), and silicon tetrachloride ($SiCl_4$). The $Si_3N_4$ layer 20 and the $SiO_2$ (TEOS) layer 18 are etched using a gas mixture of $CHF_3$ and $O_2$ and the polysilicon gate layer 16 is etched using a mixture of $SiCl_4$ and $O_2$.

The anisotropic plasma etching of the stacked dielectric layer is achieved with minimal polymer buildup on the TEOS oxide layer 18 when the hard mask layer 20 is present. This minimal polymer buildup or surface-inhibiting layer used to achieve anisotropic etching does not provide a masking effect that would otherwise result in an abrupt step in the underlying polysilicon layer 16 when the etching is completed. The thickness of TEOS layer 18 is adjusted to minimize the polymer buildup on the TEOS sidewall during etching. The TEOS layer 18 serves as a buffer layer to reduce the stress that would normally occur in the $Si_3N_4$ layer.

Continuing with the in-situ etching, the polysilicon layer 16 is anisotropically etched to complete the stacked gate electrode structure 3 having vertical sidewalls 5, which allows better control of the gate electrode length tolerance, as described later in more detail with reference to FIG. 8.

As is also shown in FIG. 2, lightly doped source/drain areas 22 are formed in the device areas adjacent to the gate electrode structures 3. Preferably the lightly doped drains are formed by ion implanting N-type impurities, such as arsenic ions ($As^{75}$) or phosphorus ions ($P^{31}$), to achieve a dopant concentration in the range of 1.0 E 16 to 1.0 E 17 atoms/cm$^3$.

Figure 3:
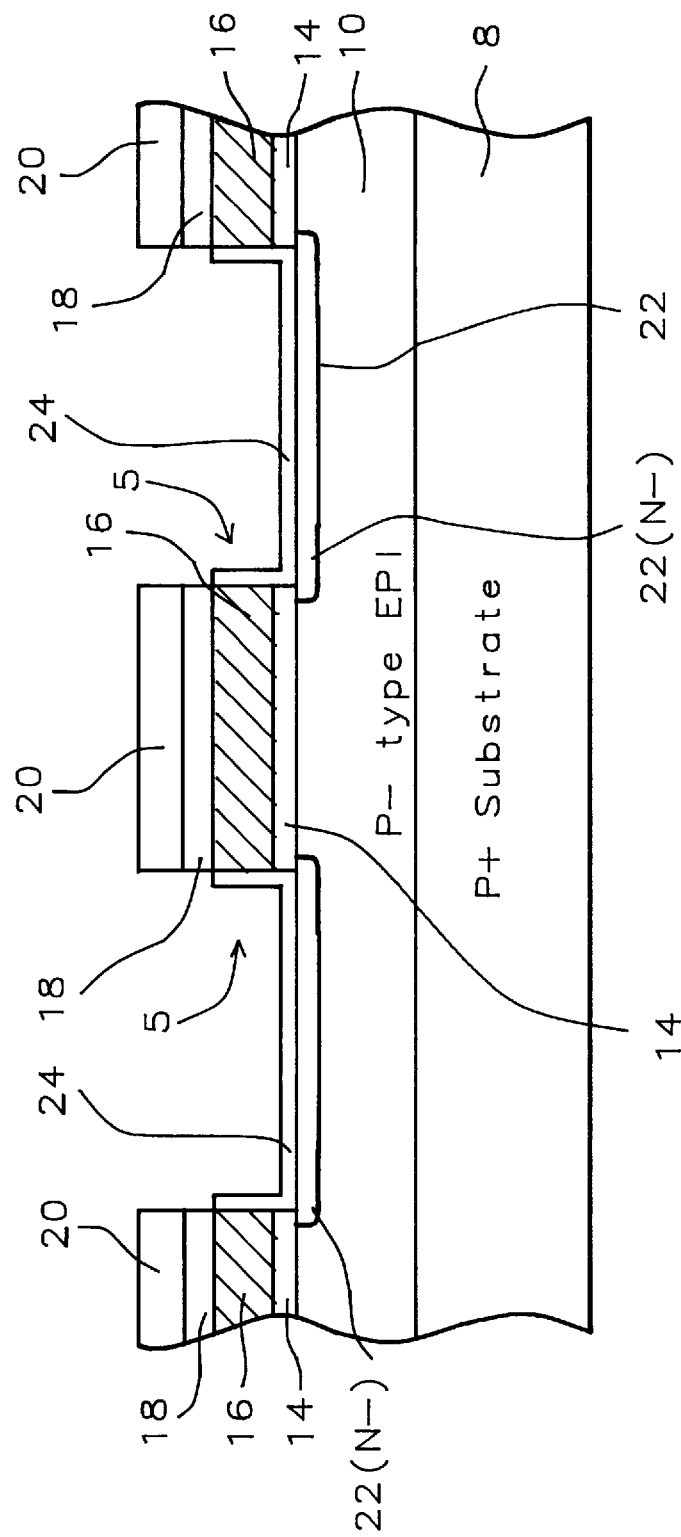

Now, as illustrated in FIG. 3, a polysilicon oxide layer 24 is grown by thermal oxidation on the sidewalls of the polysilicon layer 16, and concurrently a thermal oxide is formed on the lightly doped source/drain areas 22. Preferably the oxidation is carried out by dry oxidation in an oxidation furnace, to a thickness of between about 80 and 100 Angstroms.

Figure 4:
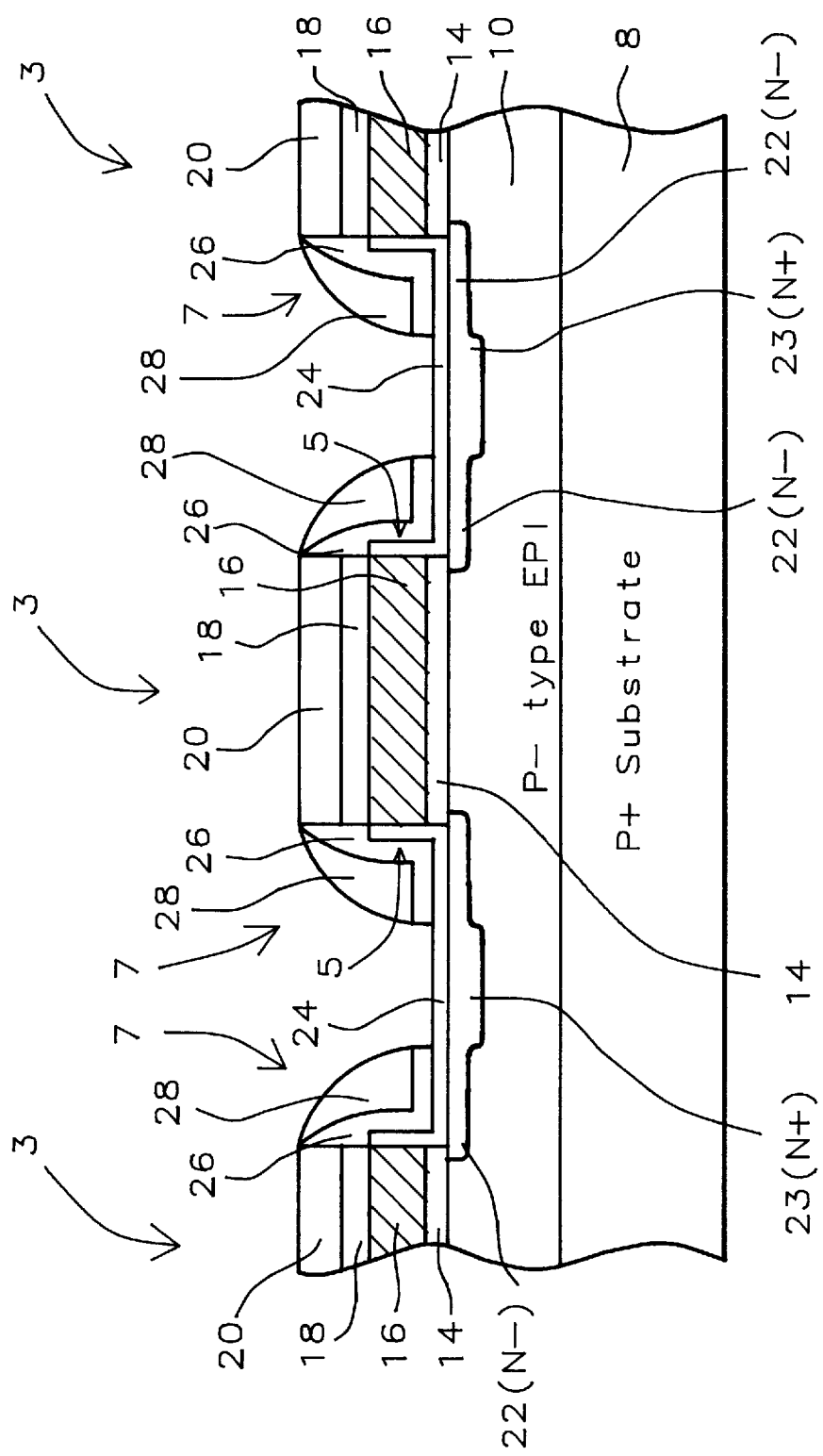

Referring to FIG. 4, a dual-dielectric sidewall spacer 7 having an L-shaped $Si_3N_4$ portion is now formed on the sidewalls 5 of the gate electrode structure 3. The sidewall spacers are formed by depositing a conformal first silicon nitride layer 26 over the stacked gate electrode structures 3, and followed by the deposition of a conformal second insulating layer 28, which are then anisotropically etched back to the hard mask 20 to form the sidewall spacers 7 from remaining portions of layers 28 and 26, as shown in FIG. 4. Preferably silicon nitride layer 26 is deposited by LPCVD using a method similar to the deposition of the hard mask layer 20, and to a thickness of between about 270 and 330 Angstroms. Second insulating layer 28 is deposited by LPCVD using TEOS as the reactant gas, and is deposited to a thickness of between about 2700 and 3300 Angstroms. As still shown in FIG. 4, the heavily doped source/drain contact areas 23 are now formed in the device areas adjacent to the sidewall spacers 7 by ion implantation. Preferably source/drain contact areas 23 are implanted with arsenic ions ($As^{75}$) which eventually have a dopant concentration in the range of about 1.0 E 19 to 1.0 E 21 atoms/cm$^3$.

Figure 5:
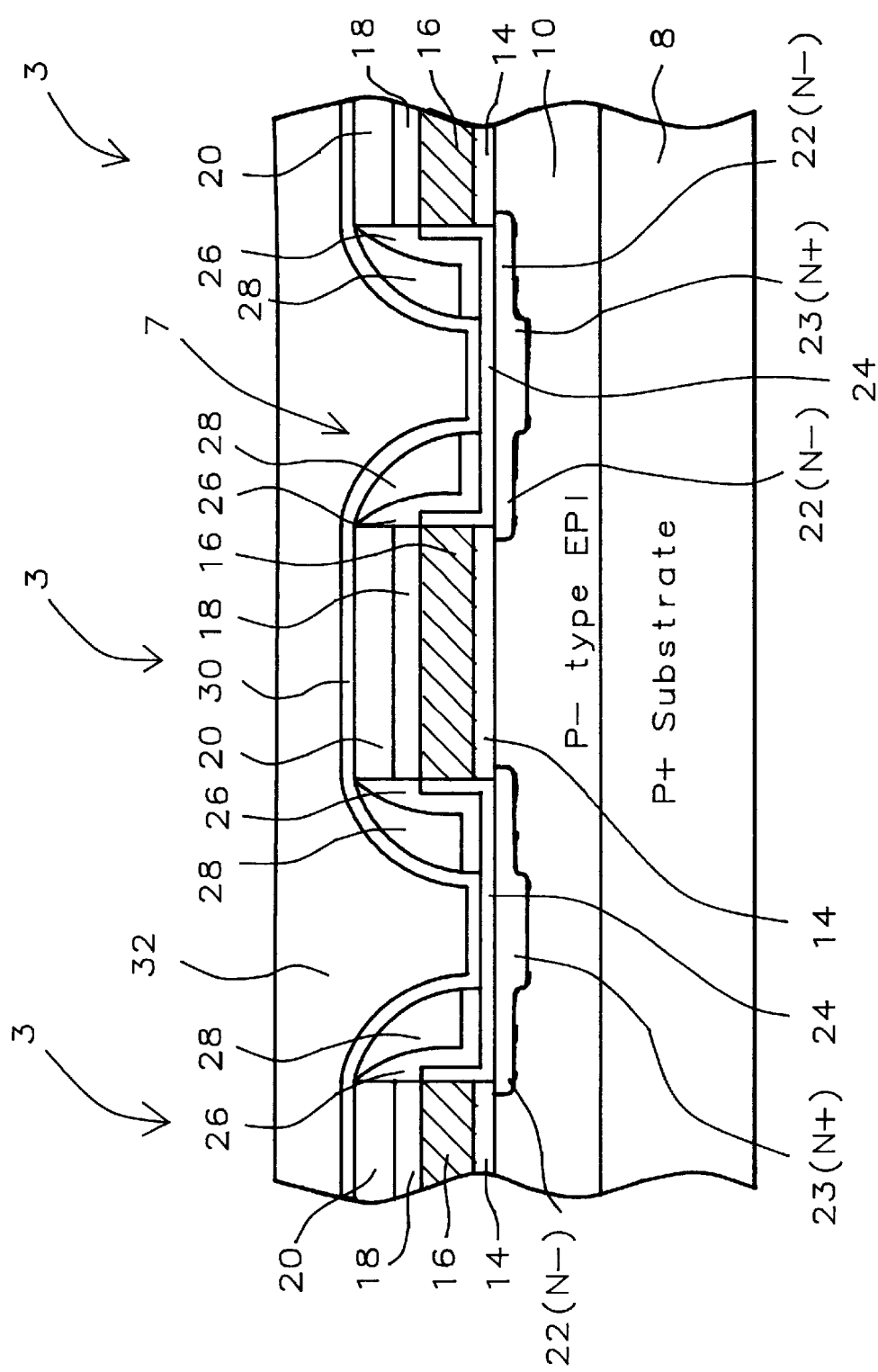

Referring now to FIG. 5, a blanket conformal second silicon nitride layer 30 is deposited over the partially completed FET gate electrode structures 3 having the sidewall spacers 7. Preferably second silicon nitride layer 30 is deposited by LPCVD in a fashion similar to the deposition of the first silicon nitride layer. Layer 30 is deposited to a thickness of between about 270 and 330 Angstroms. A third insulating layer 32, typically used as an interlevel dielectric layer (IDL), is now deposited over the second silicon nitride layer 30. Preferably third insulating layer 32 is composed of a low-flow temperature glass, more specifically a borophosphosilicate glass (BPSG), and can be deposited by atmospheric pressure CVD (APCVD) or plasma enhanced CVD (PECVD) to a thickness of between about 2700 and 3300 Angstroms. For example, the deposition can be carried out using a reactant gas, such as silane/oxygen, and dopant gases such as phosphine ($PH_3$) and boroethane ($B_2H_6$). The BPSG is then annealed in a temperature range of between about 850° and 950° C. for about 30 to 60 minutes to essentially planarize the BPSG.

Figure 6:
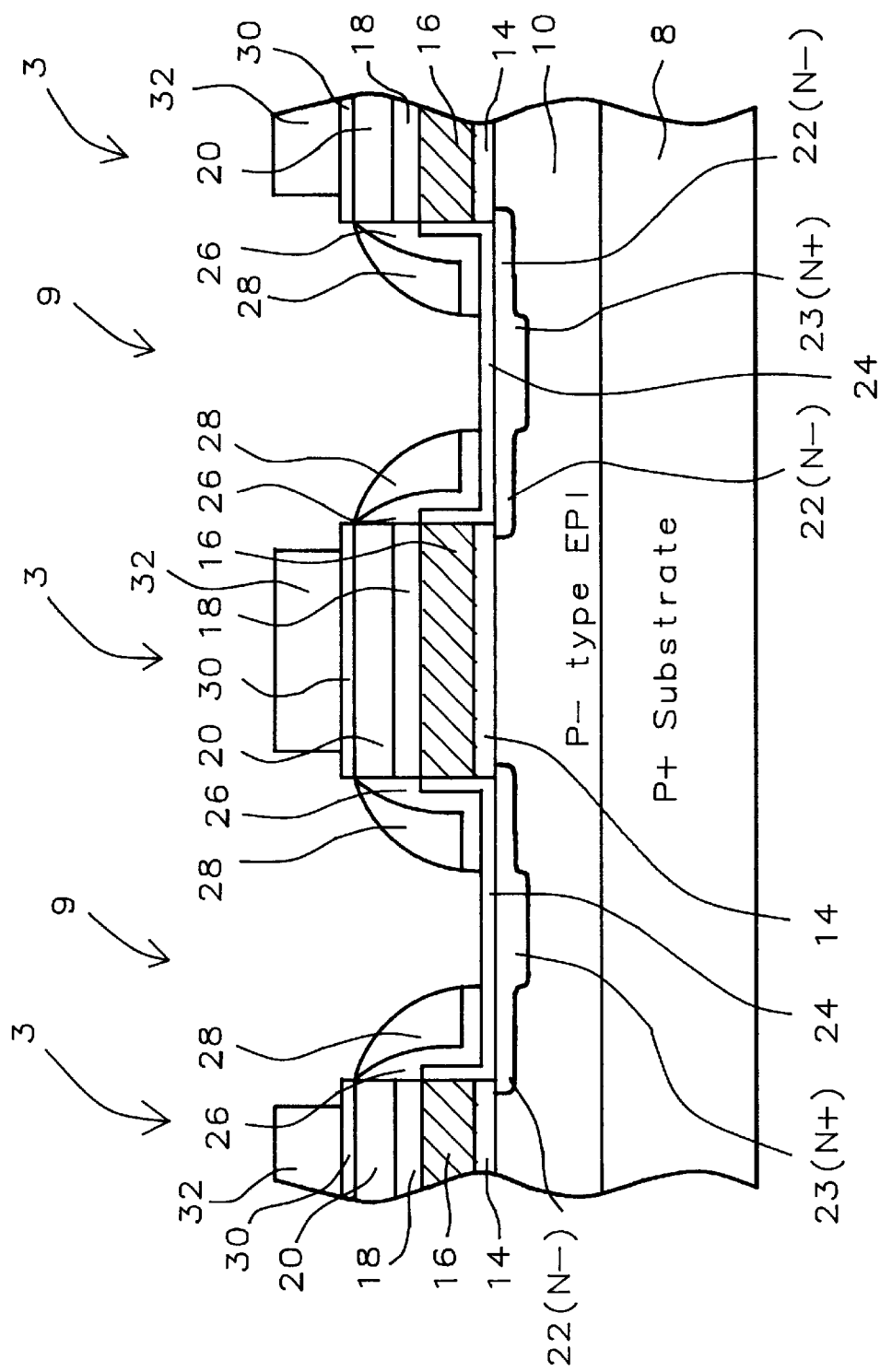

Referring now to FIG. 6, conventional photolithographic techniques and wet etching are used to form source/drain contact openings 9 in the third insulating layer 32 to the second silicon nitride layer 30. Preferably the wet etching is carried out in a buffered oxide etch (BOE) composed of a buffered hydrofluoric acid/water ($HF/H_2O$) solution. The silicon nitride layer 30 serves as an etch-stop layer for the wet etching. The contact openings 9 extend partially over the stacked gate electrode structures 3 thereby forming self-aligned source/drain contact openings over the source/drain contact areas 23 defined by the sidewall. Plasma etching is then used to remove the silicon nitride layer 30 in the source/drain contact openings 9. Preferably the etching is carried out by reactive ion etching using an etchant gas such as nitrogen trifluoride ($NF_3$).

Figure 7:
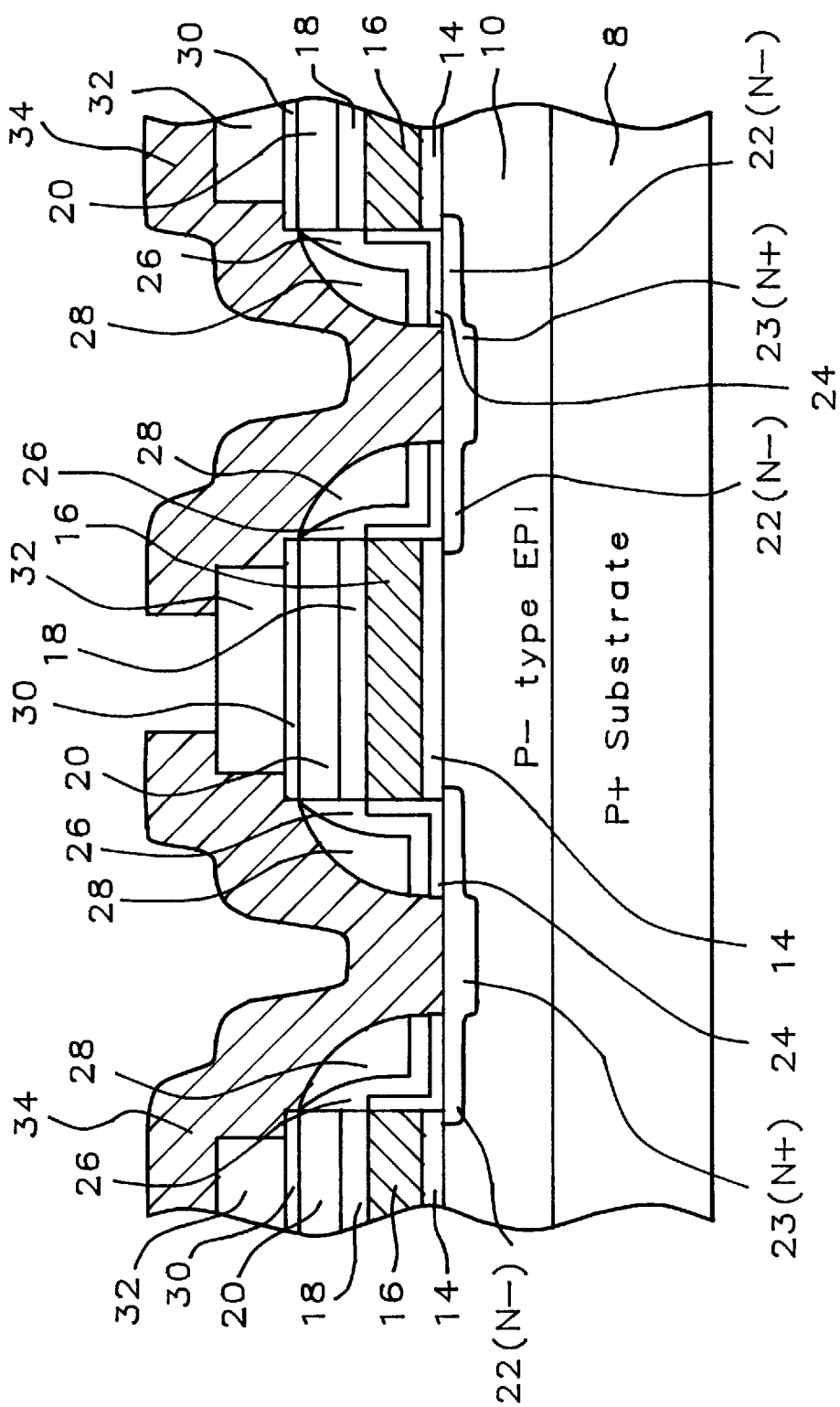

Referring to FIG. 7, the exposed polysilicon oxide layer 24 and any native oxide present on the source/drain contacts are removed using a pre-metal wet-etch dip just prior to depositing a metal layer. Preferably the etching is carried out in a $HF/H_2O$ solution. The first silicon nitride layer 26, which is contiguous with the hard mask silicon nitride layer 20, protects the first TEOS insulating layer 18 from erosion during the pre-metal etch dip. This prevents electrical shorts from occurring between the polysilicon gate electrode 16 and the source/drain contact metal which is deposited next. Whether the sidewalls formed from the second insulating layer 28 remain or not is not of significant importance.

Referring still to FIG. 7, the FET having this improved stacked gate electrode structure and dual-dielectric sidewall spacers is now completed by depositing and patterning a metal layer 34 to form electrical contacts to the source/drain contact areas 23. To provide low-resistance ohmic contacts to the source/drain contact areas 23, a metal silicide, such as titanium silicide ($TiSi_2$) or tungsten silicide ($WSi_2$) can be formed. One preferred metallurgy is aluminum (Al), because of its high electrical conductivity, having a diffusion barrier layer to prevent the silicon in the substrate from diffusing into the Al resulting in spiking through the shallow junctions, which can result in electrical shorts to the underlying substrate. For example, diffusion barrier layers such as TiW, Ti, titanium nitride (TiN) and CVD W can be used. After forming the barrier layer the Al is deposited, for example, by physical deposition, such as by sputtering or evaporation, and is typically deposited to a thickness of between about 8000 and 9000 Angstroms.

EXAMPLE

Figure 8:
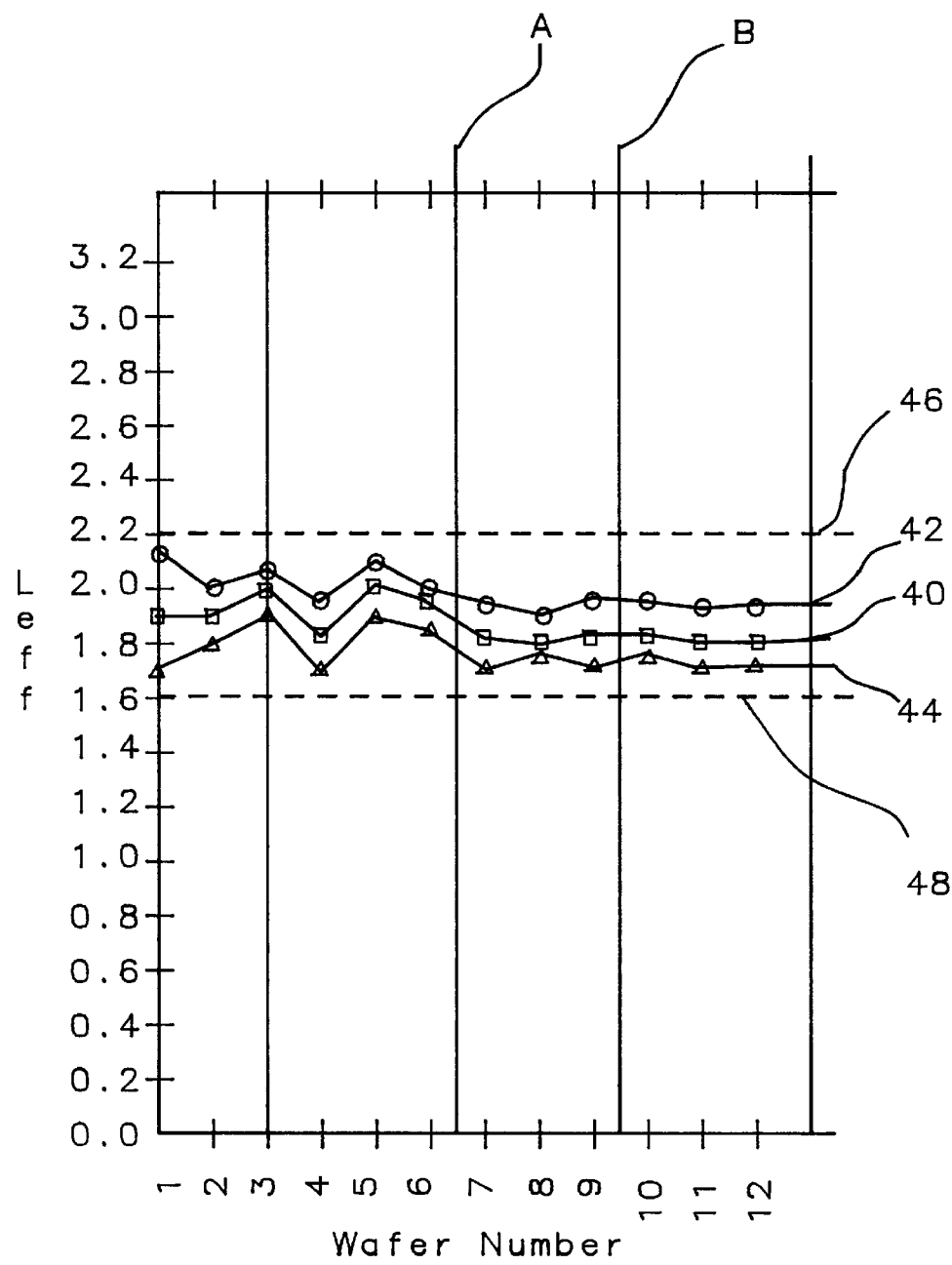
FIG. 8 is a graph showing the improved line width tolerance over the prior art.

Referring now to FIG. 8, an example is given for the improved tolerance control of the gate electrode length over the prior art. The stacked gate electrode structures were fabricated according to the prior art method and according to the method of this invention using a silicon nitride hard mask. FIG. 8 shows a plot 40 of the average gate electrode line length ($L_{eff}$) in micrometers etched in the polysilicon layer on the vertical axis, and for a series of wafers numbered along the horizontal axis. The prior art method is indicated left of the vertical line A, and the method of this invention is indicated to the right of line A. The stacked gate structures were etched for both methods in the same plasma etcher using an 8310-type etcher manufactured by the Lam Research Corp. of U.S.A. using a gas mixture of trifluoromethane ($CHF_3$), oxygen ($O_2$), and silicon tetrachloride ($SiCl_4$). Also shown are the upper 3-sigma limits 42 and the lower 3-sigma limits 44 for the gate electrode line length. The high and low specification limits are depicted in FIG. 8 by the dashed lines 46 and 48, respectively. For the prior art the average design image measured 1.641±0.053 um, while the etched polysilicon image (length) is larger, measuring 1.792±0.051 um. On the other hand, the photoresist average design image measured 1.865±0.043 um, and the measured polysilicon image (length) measured 1.896±0.07 um. As is clearly seen in FIG. 8 and the above measurements, the prior art method without the hard mask results in a polysilicon line that is significantly wider than the photoresist image. In fact, a design image of about 1.60 um is required to achieve a polysilicon image of about 1.8 um. This results also in the abrupt step at the TEOS oxide/polysilicon interface, and results in a much wider spread in control tolerance as shown in FIG. 8 to the left of line A. However, for the hard mask method of this invention (right of line A), the polysilicon line width is much closer to the design image of 1.865 um and has a much tighter control tolerance. The measurements on the wafers (7–9) between line A and line B are for a 5 percent overetch of the polysilicon, while the measurements on wafers (10–12) right of line B are for an overetch of 10 percent. Therefore, the hard mask method of this invention provides a much improved (vertical) sidewall on the stacked gate electrode structure and much improved line length control tolerances.

While the invention has been particularly shown and described with reference to the preferred embodiment thereof, it will be understood by those skilled in the art that various changes in form and details may be made without departing from the spirit and scope of the invention. For example, by reversing the polarity of the first and second conductive type dopants and appropriately selecting the dopant concentrations, it is possible to fabricate a P-channel FET by the same invention.

What is claimed is:

1. A method for making improved gate electrodes and sidewall spacers for field effect transistors (FETs) having self-aligned contacts (SAC) comprising the steps of:

providing a semiconductor substrate having device areas;

forming a gate oxide on said device areas;

depositing a polysilicon layer on said device areas and elsewhere on said substrate, said polysilicon layer being conductively doped;

depositing a first insulating layer on said polysilicon layer;

depositing a hard mask layer on said first insulating layer;

patterning by using a photoresist mask and anisotropic plasma etching said hard mask, said first insulating layer, and said first polysilicon layer, thereby forming stacked gate electrode structures having vertical sidewalls over said device areas;

forming by ion implantation lightly doped source/drain areas in said device areas adjacent to said gate electrode structures;

growing by thermal oxidation a polysilicon oxide layer on sidewalls of said polysilicon layer in said stacked gate electrode structures and concurrently on said lightly doped source/drain areas;

depositing a conformal first silicon nitride layer over said stacked gate electrode structures;

depositing a conformal second insulating layer on said first silicon nitride layer;

anisotropically plasma etching said second insulating layer and said first silicon nitride layer thereby forming insulating sidewall spacers on said sidewalls of said stacked gate electrode structures wherein said first silicon nitride layer remaining in said sidewall spacers is contiguous with said hard mask layer;

forming source/drain contact areas in said device areas adjacent to said insulating sidewall spacers by ion implanting into said substrate;

depositing a blanket conformal second silicon nitride layer;

depositing a third insulating layer and annealing to form an essentially planar surface;

photoresist masking and selectively wet etching in said third insulating layer to said second silicon nitride layer to form openings extending partially over said stacked gate electrode structures, thereby forming self-aligned source/drain contact openings over said source/drain contact areas;

plasma etching said second silicon nitride layer in said source/drain contact openings to said polysilicon oxide layer formed on said source/drain contact areas;

performing a pre-metal wet-etch dip to remove said polysilicon oxide thereby exposing said source/drain contact areas;

depositing and patterning a metal layer to form electrical contacts to said source/drain contact areas thereby completing said field effect transistors.

2. The method of claim 1, wherein said semiconductor substrate is a heavily doped single-crystal silicon having a lightly doped epitaxial layer thereon.

3. The method of claim 1, wherein said polysilicon layer is between about 2000 and 3500 Angstroms thick.

4. The method of claim 1, wherein said polysilicon layer is conductively doped having a concentration of between about 1.0 E 19 and 1.0 E 21 atoms/cm$^3$.

5. The method of claim 1, wherein said first insulating layer is composed of silicon oxide ($SiO_2$) and is deposited by chemical vapor deposition (CVD) using a reactant gas of tetraethosiloxane (TEOS).

6. The method of claim 1, wherein said first insulating layer is between about 540 and 660 Angstroms thick.

7. The method of claim 1, wherein said hard mask layer is composed of silicon nitride ($Si_3N_4$) and has a thickness of between about 1350 and 1650 Angstroms.

8. The method of claim 1, wherein said hard mask minimizes the polymer buildup on said first insulating layer sidewalls thereby resulting in said vertical sidewalls for said gate electrode structures to improve the tolerance of polysilicon gate electrode lengths.

9. The method of claim 1, wherein said polysilicon oxide layer is grown to a thickness of between about 80 and 100 Angstroms.

10. The method of claim 1, wherein said first silicon nitride layer is deposited to a thickness of between about 270 and 330 Angstroms.

11. The method of claim 1, wherein said second insulating layer is deposited by chemical vapor deposition using reactant gas tetraethosiloxane (TEOS).

12. The method of claim 1, wherein said second silicon nitride layer has a thickness of between about 270 and 330 Angstroms.

13. The method of claim 1, wherein said third insulating layer is composed of borophosphosilicate glass (BPSG) having a thickness of between about 2700 and 3300 Angstroms.

14. A method for making improved gate electrodes and sidewall spacers for field effect transistors (FETS) having self-aligned contacts (SAC) comprising the steps of:

providing a semiconductor substrate having device areas;
forming a gate oxide on said device areas;
depositing a polysilicon layer on said device areas and elsewhere on said substrate, said polysilicon layer being conductively doped;
depositing on said polysilicon layer a first insulating layer composed of a silicon oxide deposited by chemical vapor deposition (CVD) using reactant gas tetraethosiloxane (TEOS);

depositing a hard mask layer composed of silicon nitride on said first insulating layer;

patterning by using a photoresist mask and anisotropic plasma etching said hard mask, said first insulating layer, and said polysilicon layer, thereby forming stacked gate electrode structures having vertical sidewalls over said device areas;

forming by ion implantation lightly doped source/drain areas in said device areas adjacent to said gate electrode structures;

growing by thermal oxidation a polysilicon oxide layer on sidewalls of said polysilicon layer in said stacked gate electrode structures and concurrently on said lightly doped source/drain areas;

depositing a conformal first silicon nitride layer over said stacked gate electrode structures;

depositing a conformal second insulating layer on said first silicon nitride layer;

anisotropically plasma etching said second insulating layer and said first silicon nitride layer thereby forming insulating sidewall spacers on said sidewalls of said stacked gate electrode structures wherein said first silicon nitride layer remaining in said sidewall spacers is contiguous with said hard mask layer;

forming source/drain contact areas in said device areas adjacent to said insulating sidewall spacers by ion implanting into said substrate;

depositing a blanket conformal second silicon nitride layer;

depositing a third insulating layer and annealing to form an essentially planar surface;

photoresist masking and selectively wet etching in said third insulating layer to said second silicon nitride layer to form openings extending partially over said stacked gate electrode structures, thereby forming self-aligned source/drain contact openings over said source/drain contact areas;

plasma etching said second silicon nitride layer in said source/drain contact openings to said polysilicon oxide layer formed on said source/drain contact areas;

performing a pre-metal wet-etch dip to remove said polysilicon oxide thereby exposing said source/drain contact areas;

depositing and patterning a metal layer to form electrical contacts to said source/drain contact areas thereby completing said field effect transistors.

15. The method of claim 14, wherein said semiconductor substrate is a heavily doped single-crystal silicon having a lightly doped epitaxial layer thereon.

16. The method of claim 14, wherein said polysilicon layer is between about 2000 and 3500 Angstroms thick.

17. The method of claim 14, wherein said polysilicon layer is conductively doped having a concentration of between about 1.0 E 19 and 1.0 E 21 atoms/cm$^3$.

18. The method of claim 14 wherein said first insulating layer is between about 540 and 660 Angstroms thick.

19. The method of claim 14, wherein said hard mask minimizes the polymer buildup on said first insulating layer sidewalls thereby resulting in said vertical sidewalls for said gate electrode structures to improve the tolerance of polysilicon gate electrode lengths.

20. The method of claim 14, wherein said polysilicon oxide layer is grown to a thickness of between about 80 and 100 Angstroms.

21. The method of claim 14, wherein said first silicon nitride layer is deposited to a thickness of between about 270 and 330 Angstroms.

22. The method of claim 14, wherein said second insulating layer is deposited by chemical vapor deposition using reactant gas tetraethosiloxane (TEOS).

23. The method of claim 14, wherein said second silicon nitride layer has a thickness of between about 270 and 330 Angstroms.

24. The method of claim 14 wherein said third insulating layer is composed of borophosphosilicate glass (BPSG) having a thickness of between about 2700 and 3300 Angstroms.

* * * * *